United States Patent [19]

Aoki et al.

[11] Patent Number: 4,864,376
[45] Date of Patent: * Sep. 5, 1989

[54] THIN-FILM TRANSISTOR AND METHOD OF FABRICATING THE SAME

[75] Inventors: Shigeo Aoki, Habikino; Yasuhiro Ukai, Yao, both of Japan

[73] Assignee: Hosiden Electronics Co. Ltd., Osaka, Japan

[*] Notice: The portion of the term of this patent subsequent to Mar. 22, 2005 has been disclaimed.

[21] Appl. No.: 222,296

[22] Filed: Jul. 22, 1988

Related U.S. Application Data

[63] Continuation of Ser. No. 913,293, Sep. 30, 1986, abandoned.

[30] Foreign Application Priority Data

Oct. 4, 1985 [JP] Japan .................. 60-221666
Oct. 4, 1985 [JP] Japan .................. 60-221667

[51] Int. Cl.$^4$ ............................... H01L 29/78
[52] U.S. Cl. ...................... 357/23.71; 357/2; 357/4
[58] Field of Search ............ 357/23.7, 4, 2, 65

[56] References Cited

U.S. PATENT DOCUMENTS

| | | | |
|---|---|---|---|
| 3,616,527 | 11/1971 | Janning | 357/4 |
| 4,502,204 | 3/1985 | Togashi et al. | 357/23.7 |
| 4,558,340 | 12/1985 | Schachter et al. | 357/2 |
| 4,733,284 | 3/1988 | Aoki | 357/23.7 |
| 4,746,628 | 5/1988 | Takafuji et al. | 357/23.7 |

FOREIGN PATENT DOCUMENTS

| | | | |
|---|---|---|---|
| 118154 | 7/1983 | Japan | 357/23.7 |
| 48975 | 3/1986 | Japan | 357/4 |
| 1139170 | 1/1969 | United Kingdom | 357/23.7 |

Primary Examiner—Andrew J. James
Assistant Examiner—Mark Prenty
Attorney, Agent, or Firm—Pollock, Vande Sande & Priddy

[57] ABSTRACT

A thin-film transistor comprises a source electrode and a drain electrode formed in a spaced-apart relation to each other on a substrate, a semiconductor layer formed over the source and drain electrodes, a gate insulating film formed on the semiconductor layer and a gate electrode on the gate insulating film. First and second ohmic contact layers are formed in the entirety of the surface regions of the semiconductor layer which are in contact with the source and drain electrodes.

5 Claims, 5 Drawing Sheets

THIN-FILM TRANSISTOR AND METHOD OF FABRICATING THE SAME

This application continuation of Ser. No. 913,293 filed in Sept. 30, 1986 and now abandoned.

BACKGROUND OF THE INVENTION

This invention relates to a thin-film transistor which is used for an active display device using a liquid crystal, for instance.

Now, a prior art active liquid-crystal display device using thin-film transistors will be described with reference to FIG. 1.

The device comprises opposed transparent substrates 11 and 12 of glass or the like which are spaced apart by a spacer 13 provided along their edges and constitute a liquid-crystal cell 10 with a liquid crystal 14 sealed between them. A plurality of display electrodes 15 are formed on the inner surface of the substrate 11. Also, thin film transistors 16 are each formed as a switching element adjacent to each display electrode 15 with the drain connected thereto. A transparent common electrode 17 is formed on the inner surface of the other substrate 12 such that it opposes the display electrodes 15.

Each of the display electrodes 15 constitutes a picture element, that is, a pixel, for instance. As shown in FIG. 2, the display electrodes 15 are square in shape and are arrayed in a matrix on the transparent substrate 11. Gate bus lines 18 are each formed in the vicinity of and along each row of display electrodes 15 in the matrix. Source bus lines 19 are each formed in the vicinity of and along each column of display electrodes 15 in the matrix. Thin-film transistors 16 are formed at the intersections of the gate and source bus lines 18 and 19. Each thin-film transistor 16 has its gate connected to the associated gate bus line 18, its source connected to the associated source bus line 19, and its drain connected to the corresponding display electrode 15.

When a voltage is applied between a selected one of the gate bus lines 18 and a selected one of the source bus lines 19, the corresponding thin-film transistor 16 is turned on, whereby the corresponding display electrode 15 is charged through the thin-film transistor 16. As a result a voltage is applied across only that portion of the liquid crystal 14 that is found between the corresponding display electrode 15 noted above and common electrode 17, whereby the area of only that display electrode 15 is rendered transparent or light-blocking. In this way, a selective display of display electrodes 15 is obtained. The display can be erased by causing discharge of the display electrode 15.

In the prior art, the thin film transistor 16 is constructed as shown in FIGS. 3 and 4. As is shown, display electrodes 15 and source bus lines 19 of a transparent conductive film of ITO or the like are formed on the transparent substrate 11. An amorphous-silicon (a-silicon) or like semiconductor layer 21 is formed such that it strides the gap between opposite edges of the display electrode 15 and an associated source bus line 19. A gate insulating film 22 of silicon nitride or the like is formed on the semiconductor layer 21. A gate electrode 23 is formed on the gate insulating film 22 above the semiconductor layer 21 such that the gate electrode 23 partly overlies the display electrode 15 and source bus line 19. The gate electrode 23 has one end connected to the gate bus line 18. Portions of the display electrode 15 and source bus line 19 facing the gate electrode 23 constitute drain and source electrodes 15a and 19a, respectively. The thin-film transistor 16 is constituted by the drain and source electrodes 15a and 19a, semiconductor layer 21, gate insulating film 22 and gate electrode 23. The gate electrodes 23 and gate bus lines 18 are formed simultaneously from aluminum, for instance.

The semiconductor layer 21 has a photoconductive effect, that is, it becomes conductive when it is exposed to light. Therefore, when external light is incident on the semiconductor layer 21 while the thin-film transistor 16 is "off", the "off" resistance thereof decreases, and therefore the "on"-to-"off" current ratio thereof is reduced. Accordingly, a light-blocking layer 25 is formed on the substrate 11 such that it faces the semiconductor layer 21, as shown in FIG. 4. A protective layer 26 of an insulating material, e.g., silicon dioxide, is formed on the protective layer 26. Drain and source electrodes 15a and 19a are formed on the protective layer 26. Further, ohmic contact layers 27 and 28 of $n^+$-type amorphous silicon or the like are formed to provide for satisfactory ohmic contact of the drain and source electrodes 15a and 19a with respect to the semiconductor layer 21. The semiconductor layer 21 is formed on this structure. Further, a protective layer 29 of silicon nitride or the like is formed to cover the thin-film transistors 16, source buses 19 and gate buses 18 to protect the liquid crystal.

In the prior art thin-film transistor shown in FIG. 4, a transparent conductive film eventually constituting the drain and source electrodes 15a and 19a is formed on the transparent substrate 11, an $N^+$-type amorphous silicon layer eventually constituting the ohmic contact layers 27 and 28 is formed on the transparent conductive film, and then the $n^+$-type amorphous silicon layer and the transparent conductive film are etched to predetermined patterns, thus forming the display electrodes 15 and source buses 19 and the ohmic contact layers 27 and 28 over the drain and source electrodes 15a and 19a, as shown in FIG. 4. For this reason, when the widths w1 and w2 of the contact portions of the electrodes 15a and 19a in contact with the semiconductor layer 21 are reduced, the ohmic contact of these electrodes 15a and 19b with respect to the semiconductor layer 21 becomes insufficient, and the serial resistance Rs between the electrodes 15a and 19a is increased. Further, since the ohmic contact layers 27 and 28 are formed on purpose, the resistance Rs between the source and drain is increased to an extent corresponding to the thickness of the ohmic contact layers.

Further, in the prior art the transparent drain and source electrodes 15a and 19a consist of tin oxide or ITO (indium oxide and tin oxide), and the ohmic contact layers 27 and 28 and semiconductor layer 21 are formed by a plasma CVD (chemical vapor deposition) process, for instance, on the transparent electrodes. The element constituting the transparent electrodes 15a and 19a, e.g., indium or tin, is diffused as impurity into the semiconductor layer 21 and ohmic contact layers 27 and 28, so that the semiconductor layer 21 is liable to become p-type. Also, the oxygen in the transparent electrodes 15a and 19a is liable to enter the semiconductor layer 21 and ohmic layers 27 and 28 to form silicon oxide. Further, if indium or tin enters the ohmic contact layers 27 and 28, it means that a p-type impurity is introduced into the $N^+$-type layer. In such cases, the effect of the ohmic contact is deteriorated, resulting in an increase of the resistance Rs noted above. For the above reasons, thin-film transistors having satisfactory characteristics could not have heretofore been obtained.

If a liquid-display device of the type described above is to have a large display area and a high resolution of display, a large number of display electrodes 15 should be formed at a high density. Also, the source bus lines 19 should be of a considerable length. This means that because of a voltage drop the potential at a point on each source bus line 19 becomes lower as the point departs from one end of the source bus line connected to the voltage supply. In other words, a brightness gradient is produced on the display such that the brightness of a pixel becomes lower as the pixel is located farther away from the end connected to the voltage supply terminal. From these points, it is desired that the source bus 19 has a sufficient thickness. More specifically, it is desired to provide a sufficient thickness of the source bus 19 to reduce the resistance thereof so that the same brightness can be obtained over the entire display surface.

Further, in order to avoid influence of external light on the thin-film transistor due to the photo-conductive effect of the semiconductor layer 21, the semiconductor layer 21 is desirably as thin as possible. In the prior art, a transparent conductive film eventually constituting the electrodes 15a and 19a is formed, an N+-type layer eventually constituting the ohmic contact layers 27 and 28 is formed, and then these layers are etched to a predetermined pattern to form the display electrodes 15 and source buses 19. To obtain a high density pattern at this time, the layers are etched by an anisotropic etching process, in which etching mainly proceeds only in the direction perpendicular to the transparent substrate 11. This means that the etched side surfaces of the source buses 19 are almost perpendicular to the substrate 11. Therefore, if the source bus 19 is formed such that it is sufficiently thick, the deposition of the semiconductor layer 21 on the side surfaces of the bus 19 is liable to be insufficient. For this reason, the thickness of the semiconductor layer 21 has to be above a certain value; heretofore, it should be about 1,000 angstroms, for instance. Because of the comparatively large thickness of the semiconductor layer 21 as noted above, the thin-film transistor has been greatly influenced by the photoconductive effect of the semiconductor layer 21. This means that the light-blocking layer 25 as noted before in connection with FIG. 4 has been necessary. The manufacturing process is thus complicated by that requirement. Further, with pattern density increase the width of the ohmic contact layers 27 and 28 is reduced. This leads to unsatisfactory ohmic contact between the electrodes 15a and 19a and semiconductor layer 21. More specifically, this leads to an off-set in the drain current versus drain voltage characteristic of the thin-film transistor 16, that is, the drain current is not caused unless the drain voltage exceeds a certain level. Therefore, the gradation control range of the liquid crystal display device for gradation display is reduced.

SUMMARY OF THE INVENTION

An object of the invention is to provide a thin-film transistor which has a satisfactory ohmic contact between source and drain electrodes and a semiconductor layer.

Another object of the invention is to provide a thin-film transistor which can provide a sufficiently large "on"-to-"off" ratio although it is free from any light-blocking layer.

In the thin-film transistor according to the invention, ohmic contact layers are formed over the entire contact areas of the semiconductor layer in contact with the source and drain electrodes. Thus, satisfactory ohmic contact is obtained between the semiconductor layer and electrodes to reduce the resistance Rs. Particularly, the source and drain electrodes preferably contain diffused phosphorus or boron. Such electrodes can be obtained either by forming a transparent conductive film which originally contains phosphorus or boron, or by forming, first, the conventional transparent conductive film and then diffusing thereinto phosphorus or boron. The transparent conductive film thus formed is etched to the pattern of the source and drain electrodes. Then, a semiconductor layer, a gate insulating film and a gate electrode are formed in the mentioned order. In this case, there is no need of providing any ohmic contact layer formation step. This is so because at the time of the formation of the semiconductor layer, the phosphorus or boron that has been diffused in the source and drain electrodes migrates into the contact surface of the semiconductor layer during formation of the latter thus automatically forming the ohmic layers. Besides, indium or tin in the source and drain electrodes is prevented from entering the semiconductor layer due to its coupling with phosphorus or boron. The dopant element contained in the source and drain electrodes is not limited to phosphorus and boron, but it may be a Group V element such as arsenic, bismuth and antimony or a Group III element such as aluminum and gallium as well.

Further, in the thin-film transistor according to the invention the opposed sides of the source and drain electrodes are tapered, ohmic contact layers are formed over the entirety of the tapered surface, and the semiconductor layer is formed to extend over these ohmic contact layers. Since the opposed sides of the source and drain electrodes are constituted by tapered surfaces, it is possible to reduce the thickness of the semiconductor layer formed on these electrodes to be less than 500 angstroms, typically 100 to 200 angstroms, which corresponds approximately one tenth of the thickness present in the prior art thin-film transistor. Thus, it is possible to sufficiently increase the resistance of the semiconductor layer. As a result, a sufficiently high "off" resistance of the transistor can be obtained even under irradiation of light, thus making it unnecessary to use a light-blocking layer.

DETAILED DESCRIPTION OF THE PREFERRED EMBODIMENTS

Figure 1:
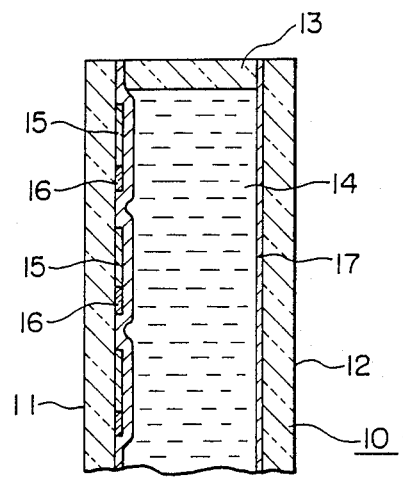
FIG. 1 is a fragmentary sectional view showing a prior art liquid crystal display device.
Figure 2:
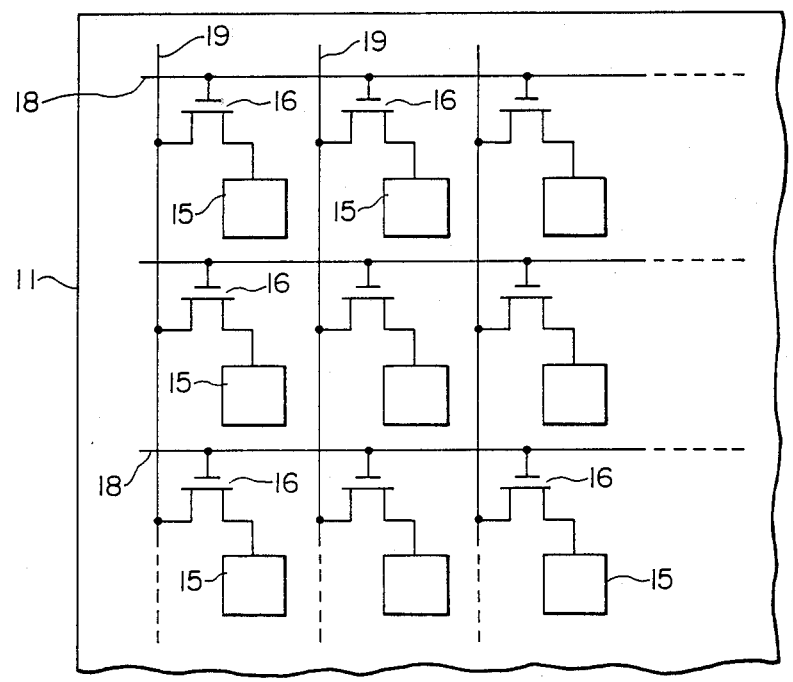
FIG. 2 is an equivalent electric circuit diagram showing the prior art liquid crystal display device.
Figure 3:
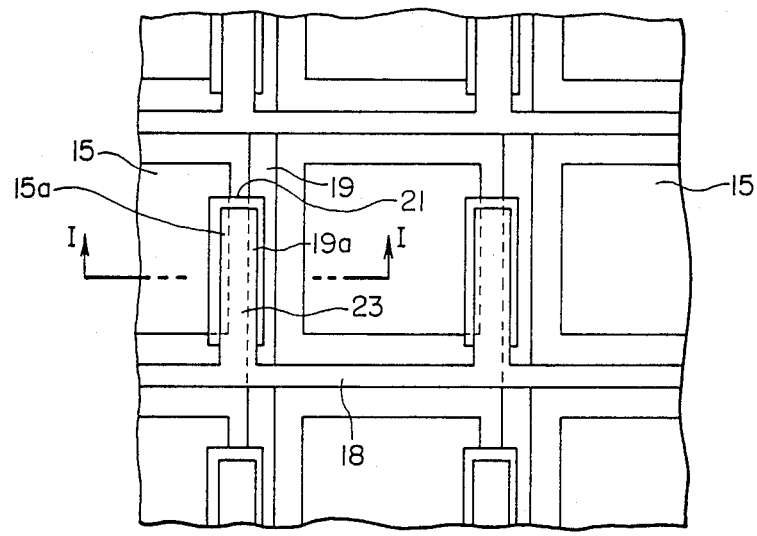
FIG. 3 is a plan view showing a substrate with display electrodes formed thereon of the prior art liquid crystal display device.
Figure 4:
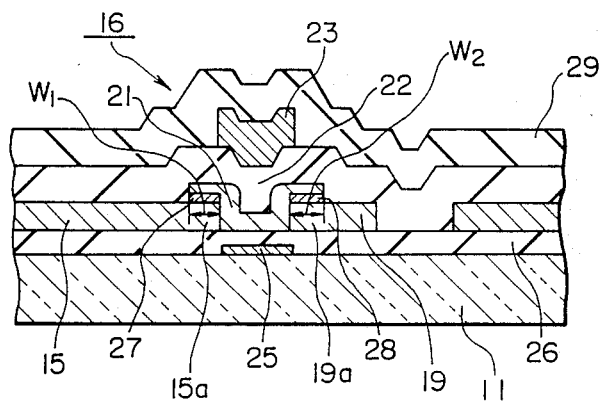
FIG. 4 is a sectional view taken along line I—I in FIG. 3.
Figure 5A:
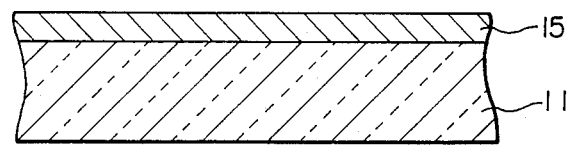
FIGS. 5A to 5D are sectional views showing processes for fabricating a thin-film transistor embodying the invention.
Figure 5B:
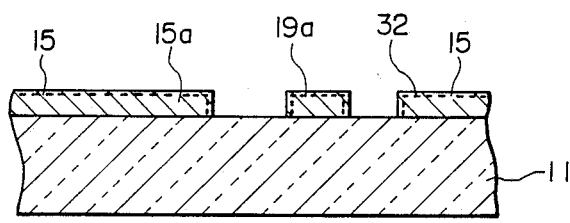

Now, a first embodiment of the invention will be described in conjunction with the method of its manufacture. As shown in FIG. 5A, a transparent conductive film 31 of ITO of the like is formed on a transparent substrate 11 of glass or the like. The transparent conductive film 31 is then etched to a predetermined pattern, thus forming drain and source electrodes 15a and 19a as shown in FIG. 5B. In the case of the liquid crystal display device, display electrodes 15 and source buses 19 which are described before in connection with FIGS. 3 and 4 are simultaneously formed. In this embodiment, phosphorus is diffused into transparent electrodes 15a and 19a. That is, a phosphorus-containing layer 32 is formed on the entire surfaces of the electrodes 15, 15a and 19a. Phosphorus may be introduced plasma assisted CVC process, for instance. In the by a instant case, phosphorus is introduced from the surface of the electrodes 15a and 19a through plasma assisted CVD process, which is performed for several minutes with the substrate 11 held at 200° to 300° C. and in an atmosphere under pressure of $10^2$ Torr while supplying argon gas containing 5,000 ppm of $OH_3$ gas into the atmosphere at a rate of 10 cc/min. under a glow discharge with RF power of 20 W.

Figure 5C:
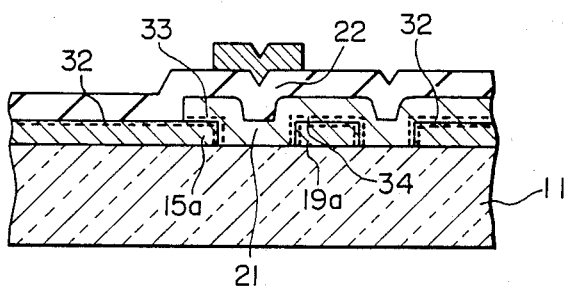
Figure 5D:
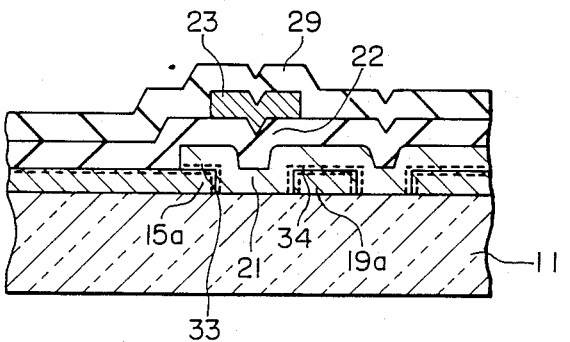

After the phosphorus-containing layer 32 has been formed in this way, a semiconductor layer 21 of amorphous silicon, for instance, is formed in the same manner as in the prior art as shown in FIG. 5C. Then, a gate insulating film 22 of silicon nitride is formed on the semiconductor layer 21. Then, a gate electrode 23 is formed together with gate bus 18 on the gate insulating film 22. Then, a protective layer 29 of silicon nitride, for instance, is formed as shown in FIG. 5D.

The semiconductor layer 21 is also formed by an RF plasma assisted CVD process with the substrate held at 20° to 300° C. At this time, the phosphorus in the phosphorus-containing layer 32 is diffused into the accumulating semiconductor layer 21, whereby ohmic contact layers 33 and 34 containing phosphorus are formed in the entire surface regions of the semiconductor layer 21 in contact with the electrodes 15a and 19a as shown in Fig. 5C. The ohmic contact layers are formed very thinly but reliably and across the entire area of the semiconductor layer 21 in contact with the electrodes 15a and 19a, i.e., not only the top surface of the electrodes 15a and 19a (on the side of the gate insulating film 22) but also on the side surfaces thereof. Thus, a satisfactory ohmic contact between the electrodes 15a and 19a and semiconductor layer 21 is obtained. It is thus possible to obtain a thin-film transistor, in which the resistance Rs noted above is low and the drain current versus drain voltage characteristic is free from off-set. Further, since the ohmic contact layers 33 and 34 are very thin, the thickness of the semiconductor layer 21 can be reduced, permitting reduction of the resistance Rs. It is also possible to reduce the influence of external light on the semiconductor layer 21 due to the photoconductive effect and increase the "off" resistance.

When diffusing phosphorus into the transparent source and drain electrodes through the plasma assisted CVD, phosphorus is also diffused into the exposed surface of the glass substrate 11 though the amount of diffusion is very small compared to that of the diffusion into the source and drain electrodes of ITO. The phosphorus diffused in the surface region of the glass substrate 11 remains there and serves as a so-called "getter" which fixes sodium or the like in the neighborhood thereof in the glass substrate 11. Particularly, sodium or the like in the glass substrate 11 in a surface region adjacent a channel of the semiconductor layer 21 between the electrodes 15a and 19a is effectively prevented from diffusing into the channel, so that stable operation of the thin-film transistor is ensured.

Further, during the formation of the semiconductor layer 21 indium or tin in the transparent electrodes 15a and 19a is coupled to phosphorus, thus preventing the indium or tin from being diffused into the semiconductor layer 21. If necessary, the phosphorus containing layer 32 on areas other than the transparent electrodes 15a and 19a may be removed when etching the semiconductor layer 21 to a predetermined shape. Further, phosphorus may be diffused in the transparent electrodes not only by the plasma assisted CVD process but also thermal diffusion. Further, it is possible to introduce phosphorus simultaneously with the formation of the transparent conductive film. Further, other elements than phosphorus, e.g., boron, may be introduced into the transparent electrodes.

Figure 6:
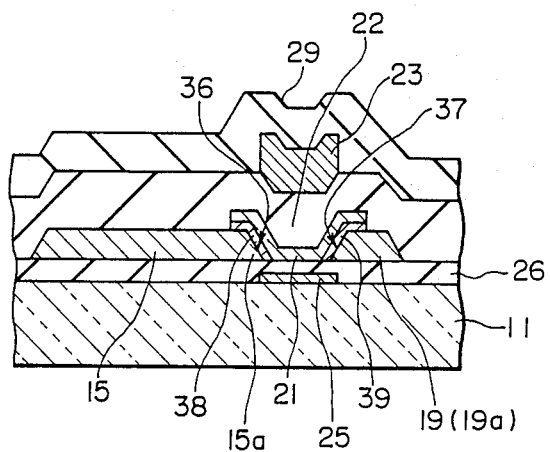
FIG. 6 is a sectional view showing a different embodiment of thin-film transistor according to the invention.

The ohmic contact layers may also be formed over the entire contact areas of the semiconductor layer 21 in contact with the drain and source electrodes 15a and 19a as follows. As shown in FIG. 6, in which parts like those in FIG. 4 are designated by like reference numerals, according to the invention the opposed sides of the drain and source electrodes 15a and 19a are constituted by tapered surfaces 36 which approach each other toward the surface of the glass substrate 11. The tapered surfaces 36 and 37 are formed through isotropic etching when the display electrodes 15 and source buses 19 are formed through etching of the transparent conductive film after formation thereof. The isotropic etching proceeds at the same rate in the perpendicular and parallel directions with respect to the substrate 11. The tapered surfaces 36 and 37 have an inclination angle of 45° with respect to the substrate 11.

Ohmic contact layers 38 and 39 of $N^+$-type are formed at least over the entire tapered surfaces 36 and 37. The semiconductor layer 21 of amorphous silicon is formed over the tapered surfaces 36 and 37. Thereafter, a gate insulating film 22, a gate electrode 23 and then an insulating layer 29 are formed.

In the above case, for the formation of the ohmic contact layers 38 and 37, after the formation of the display electrodes 15 and source buses 19, phosphorus is diffused over the entire surface and then etched to a predetermined pattern before formation of the semiconductor layer 21. However, this is by no means limitative. For example, as has been described in connection with FIGS. 5A to 5D, a transparent conductive film originally containing phosphorus, for instance, may be formed and then etched into the display electrodes 15 and source buses 19. The semiconductor layer 21 is formed directly by the plasma assisted CVD process on the electrodes 15a and 19a. At this time, the phosphorus in the electrodes 15a and 19a is migrated to be diffused into the semiconductor layer 21. In this way, $N^+$-type ohmic contact layers 33 and 34 are formed automatically on the contact areas of the semiconductor layer 21 in contact with the electrodes 15a and 19a.

According to one aspect of the invention, the opposed sides of the drain and source electrodes 15a and 19a are constituted by the tapered surfaces 36 and 37. Therefore, satisfactory contact of the semiconductor layer 21 can be obtained over the entire contact areas of the electrodes 15a and 19a even where the semiconductor layer 21 is very thin, e.g., 100 to 200 angstroms. By reducing the thickness of the semiconductor layer 21 the resistance thereof is increased, so that the "off" resistance of the thin-film transistor can be increased to be less affected by external light. High "off" resistance thus can be obtained, so that it is possible to omit the light-blocking layer 25.

Further, the ohmic contact layers 33 and 34 or 38 and 39 are formed over the entire contact areas of the semiconductor layer 21 in contact with the electrodes 15a and 19a. It is thus possible to obtain ohmic contact between semiconductor layer 21 and electrodes 15a and 19a over a sufficient area. Thus, drain current versus drain voltage characteristics as shown by solid curves in FIG. 7 can be obtained, which are free from off-set.

Figure 7:
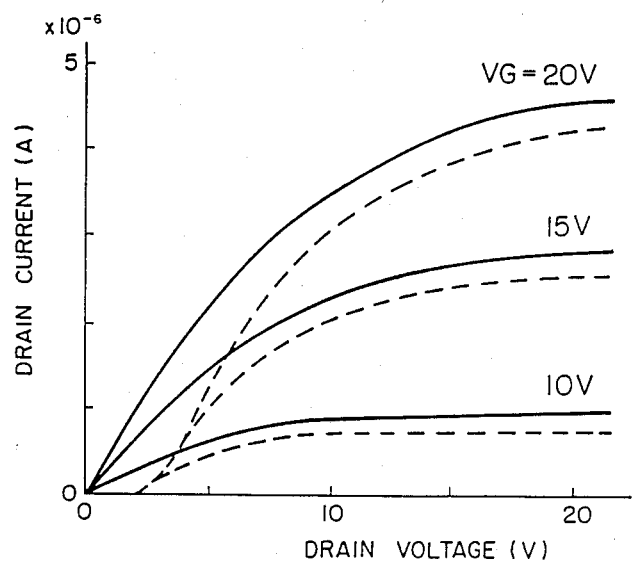
FIG. 7 is a graph showing drain current versus drain voltage characteristics.

In the prior art case, however, there is an off-set $V_{of}$ as shown by dashed curves, and the drain current is not caused unless the drain voltage is increased to exceed the off-set voltage $V_{of}$. Therefore, the prior at liquid-crystal display device has a narrow gradation range for gradation display. In contrast, according to the invention a satisfactory gradation display can be obtained because of the freedom from the off-set. In addition, the drain current itself is higher than that in the prior art as shown in FIG. 7. Thus, current can be supplied to the display electrode at a high speed, so that it is possible to obtain a high speed operation.

Figure 8:
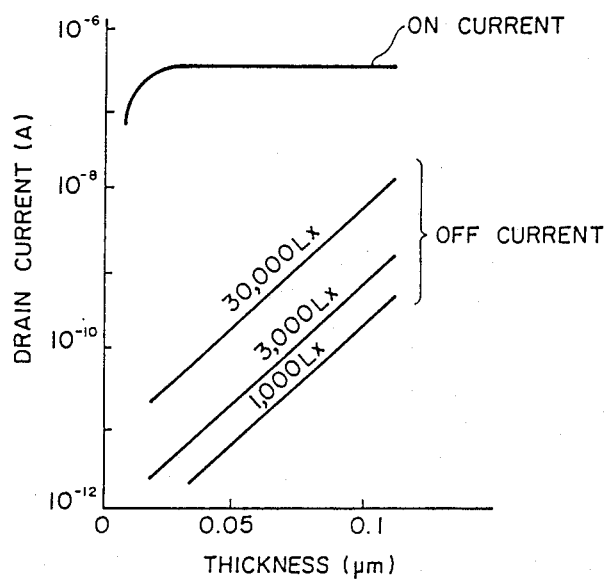
FIG. 8 is a graph showing drain current versus semiconductor layer thickness characteristics.

FIG. 8 shows "off" current characteristics in the case when the gate voltage is 0 V and the drain voltage is 5 V, with illumination intensity of external light being taken as a third parameter. The "on" current in the thin-film transistor is fixed irrespective of the thickness of the semiconductor layer 21. The "on" current characteristic is in the case when the gate voltage is 10 V and drain voltage is 5 V. According to the invention the thickness of the semiconductor layer 21 can be made less than 0.05 μm (i.e. 500 Å), whereas in the prior art it can not be made less than 0.1 μm. According to the invention, therefore, the "off" current can be reduced by more than one digit place when compared to the prior art.

Figure 9:
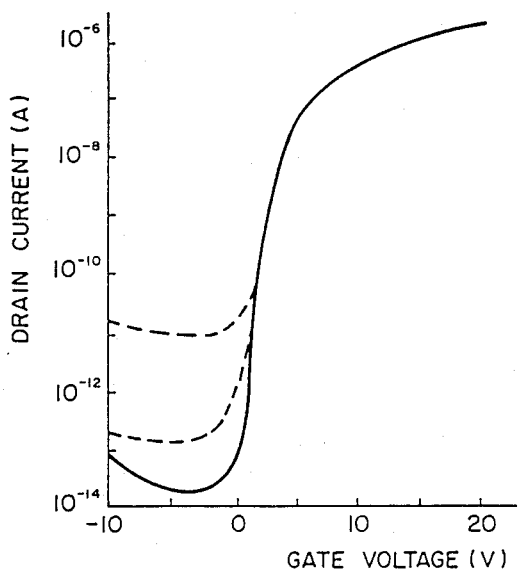
FIG. 9 is a graph showing drain current versus gate voltage characteristics.

FIG. 9 shows drain voltage versus gate voltage characteristics. As is shown, when the gate voltage is below 0 V, the drain current is extremely low in the absence of external light as shown by a solid line 41. A high "on"-to-"off" ratio thus can be obtained. Where the external light illumination intensity is 10,000 Lx and the light-blocking layer 25 is not provided, the necessary "on"-to-"off" ratio can be obtained by reducing the thickness of the semiconductor layer 21 (to 0.03 μm in this example) as shown by dashed curve 42. Where there is external light of 100,000 Lx, an "on"-to-"off" characteristic as shown by dashed curve 43 can be obtained by the provision of the light-blocking layer 25. In the case of FIG. 9, the drain voltage is 10 V, and the channel of the semiconductor layer 21 has a length of 10 μm and a width of 100 μm.

As has been described in the foregoing, according to the invention ohmic contact layers are formed over the entire contact areas of the semiconductor layer in contact with the transparent electrodes, so that it is possible to reduce the resistance Rs noted above. Further, by forming transparent electrodes containing phosphorus or boron, the resistance Rs can be further reduced, and a stable thin-film transistor can be obtained.

Further, with the thin-film transistor comparatively to the invention the drain bus 19 may have a comparatively large thickness, e.g., 1,000 angstroms or above. Thus, the resistance of the drain bus 19 can be reduced to obtain a wide area display device, which is free from brightness gradient but can provide a substantially uniform brightness over the entire display surface. Further, since the opposed sides of the drain and source electrodes are constituted by tapered surfaces, the semiconductor layer may be made sufficiently thin so that a sufficient "on"-to-"off" current ratio can be obtained without provision of any light-blocking layer. In addition, ohmic contact between the semiconductor layer 21 and electrodes 15a and 19a can be obtained over a wide area. A drain current versus drain voltage characteristic which is free from off-set thus can be obtained, thus permitting fine and wide range gradation control for gradation display. Further, the drain current is high so that a high speed operation is possible.

Further, as has been shown, by using electrodes containing phosphorus or boron as the electrodes 15a and 19a, satisfactory ohmic contact layers 36 and 37 can be obtained without any particular step for forming them. Further, the tapered surfaces 36 and 37 are formed without need of increasing the steps, i.e., without need of any particular step, but by carrying out the etching for the electrode formation as isotropic dry etching or wet etching. Further, while the tapered surfaces 31 and 32 are formed, the channel area may be made the same as in the prior art, that is, it is possible to reduce the channel length.

What is claimed is:

1. A thin-film transistor comprising:
    source and drain electrodes made of ITO containing either n-type or p-type impurity and formed on a substrate in a spaced-relation to each other, said electrodes having edges which are substantially parallel to each other and top surfaces which are spaced from said substrate, said edges defining tapered side surfaces thereof which respectively depart from each other as they approach said top surfaces of said source and drain electrodes;
    a semiconductor layer of the same type of conductivity as said impurity formed on said substrate between said source and drain electrodes, said semiconductor layer having portions which overlie said tapered side surfaces and said top surfaces of said source and drain electrodes; and
    first and second ohmic contact layers formed integrally with said semiconductor layer by diffusion of said impurity from said source and drain electrodes into said semiconductor layer in the entire surface regions thereof where said semiconductor layer is in contact with said source and drain electrodes, respectively, each of said first and second ohmic contact layers in said surface regions of said semiconductor layer extending continuously along said tapered side surfaces and said top surfaces of corresponding ones of said source and drain electrodes.

2. A thin-film transistor according to claim 1 wherein said impurity is a group V element selected from the group consisting of phosphorus, arsenic, antimony and bismuth, and said first and second ohmic contact layers are n+- type semiconductor layers.

3. A thin-film transistor according to claim 1 wherein said impurity is a group III element selected from the group consisting of boron, aluminum or gallium, and said first and second ohmic contact layers are p+- type semiconductor layers.

4. A thin-film transistor according to claim 2 or claim 3 wherein said semiconductor layer is constituted by amorphous silicon.

5. A thin-film transistor according to claim 2 or claim 3 wherein said substrate is a transparent substrate.

* * * * *